United States Patent
Wu et al.

(10) Patent No.: US 10,340,914 B1
(45) Date of Patent: Jul. 2, 2019

(54) POWER CONVERTING DEVICE AND METHOD

(71) Applicant: ANPEC ELECTRONICS CORPORATION, Hsinchu (TW)

(72) Inventors: Tse-Hsu Wu, Hsinchu (TW); Yun-Chiang Chang, Hsinchu (TW); Fu-Chuan Chen, Hsinchu (TW)

(73) Assignee: ANPEC ELECTRONICS CORPORATION, Hsinchu (TW)

(*) Notice: Subject to any disclaimer, the term of this patent is extended or adjusted under 35 U.S.C. 154(b) by 0 days.

(21) Appl. No.: 16/136,779

(22) Filed: Sep. 20, 2018

(30) Foreign Application Priority Data

Jun. 8, 2018 (TW) ............................ 107119826 A

(51) Int. Cl.
*H02M 1/096* (2006.01)
*G06F 1/04* (2006.01)
*G06F 1/3206* (2019.01)
*H03K 19/00* (2006.01)
*H02M 1/00* (2006.01)

(52) U.S. Cl.
CPC ............ *H03K 19/0016* (2013.01); *G06F 1/04* (2013.01); *G06F 1/3206* (2013.01); *H02M 1/096* (2013.01); *H02M 2001/0012* (2013.01)

(58) Field of Classification Search
CPC ............... H02M 1/092; H02M 1/096; H02M 2001/0012; H02M 1/08; H02M 1/083; H02M 7/06; H02M 1/42; H03K 17/13; H03K 17/133; H03K 17/284; H03K 7/08; H03K 17/94; H03K 2005/00286

USPC .................. 323/271; 327/108, 109, 112, 544
See application file for complete search history.

(56) References Cited

U.S. PATENT DOCUMENTS

| | | | |
|---|---|---|---|
| 2013/0207625 A1* | 8/2013 | Futamura ................. | G05F 1/10 323/271 |
| 2014/0160601 A1* | 6/2014 | Ouyang ................ | H02M 3/158 361/18 |
| 2015/0115920 A1* | 4/2015 | Kruiskamp ........... | H02M 3/156 323/282 |
| 2015/0145489 A1* | 5/2015 | Hou .................... | H02M 3/1588 323/271 |
| 2015/0303800 A1* | 10/2015 | Childs ................... | H02M 3/158 323/271 |
| 2015/0349630 A1* | 12/2015 | Peng .................... | H02M 3/156 323/282 |
| 2017/0063227 A1* | 3/2017 | Nakamura ............ | H02M 3/158 |

* cited by examiner

*Primary Examiner* — John W Poos
(74) *Attorney, Agent, or Firm* — Li & Cai Intellectual Property (USA) Office

(57) ABSTRACT

A power converting device and a method thereof are provided. The power converting device includes a filter circuit, a zero-crossing comparison circuit, a counting circuit, a logic circuit, an oscillation circuit, and a control circuit. The zero-crossing comparison circuit outputs a zero-crossing signal when an inductor current is equal to a zero current. The counting circuit counts a time interval between two consecutive time points at which the inductor currents are equal to the zero current in a low power mode. When the logic circuit determines that the time interval is greater than a first time threshold, the control circuit transmits a first oscillating signal to the filter circuit from the oscillation circuit; otherwise, it outputs a second oscillating signal; it outputs a pulse-skipping mode signal when the interval time is less than a second time threshold.

10 Claims, 9 Drawing Sheets

POWER CONVERTING DEVICE AND METHOD

CROSS-REFERENCE TO RELATED PATENT APPLICATION

This application claims the benefit of priority to Taiwan Patent Application No. 107119826, filed on Jun. 8, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a converting device, and more particularly to a power converting device and a power converting method thereof.

BACKGROUND OF THE DISCLOSURE

A variety of power converters have been widely used to provide regulated voltages and currents to a variety of electronic products. Power converters have been required to meet power management and energy conservation standards based on environmental pollution constraints. The principle of power management is to manage the power consumption of the system during operation. During non-operational periods, only small amount of power will be consumed. Regarding the power converter in the power management application, in the light load state, saving power is the main demand nowadays.

SUMMARY OF THE DISCLOSURE

In order to solve the problem of the prior art, the present disclosure provides a power converting device, applicable to an electronic element, the electronic device respectively outputs a normal operation signal and a low power signal in a normal operation mode and a low power mode, and the power converting device including:

a filter circuit including an inductor and a capacitor, wherein two ends of the capacitor are respectively coupled to one end of the inductor and grounded; and a load detecting circuit, including:

a zero-crossing comparison circuit having a first input terminal and a second input terminal respectively coupled to another end of the inductor and a ground terminal, wherein when the zero-crossing compares that an inductor current flowing through the inductor is equal to a zero current, outputs a zero-crossing signal;

a counting circuit coupled to the electronic element and the zero-crossing comparison circuit, wherein when the counting circuit receives the low power signal and the zero-crossing signal, the counting circuit starts to count at a first time point when the inductor current equals to the zero current, and stops to count until the inductor current equals to the zero current again at a second time point, and counts a time interval between the first and second time points; and a logic circuit coupled to the counting circuit, wherein the logic circuit stores a first time threshold and a second time threshold, outputs a first frequency selection signal when the logic circuit compares that the time interval is larger than the first time threshold, outputs a second frequency selection signal when the logic circuit compares that the time interval is smaller than the first time threshold, and outputs the first frequency selection signal and a pulse-skipping mode signal when the logic circuit compares the time interval is smaller than the second time threshold;

an oscillation circuit coupled to the logic circuit, wherein the oscillation circuit outputs a first oscillating signal and a second oscillating signal, and wherein a second oscillating frequency of the second oscillating signal is smaller than a first oscillating frequency of the first oscillating signal; and a control circuit coupled to the logic circuit, the oscillation circuit and the another end of the inductor, wherein when the logic circuit outputs the first frequency selection signal, the control circuit transmits the first oscillating signal from the oscillation circuit to the filter circuit, when the logic circuit outputs the second frequency selection signal, the control circuit transmits the second oscillating signal from the oscillation circuit to the filter circuit, and when the control circuit receives the pulse-skipping mode signal, the control circuit modulates the first oscillating signal from the oscillation circuit as a pulse-skipping signal to output to the filter circuit, and operates in a pulse-skipping mode.

In addition, the present disclosure provides a power converting method, applicable to the power converting device mentioned above, the power converting method including:

using the counting circuit to receiving the low power signal from the electronic element;

using the zero-crossing comparison circuit to compare the zero current to the inductor current, and when the inductor current equals to the zero current, outputting the zero-crossing signal to the counting circuit;

using the counting circuit to start to count at the first time point when the inductor current reaches to the zero current, stop to count until the inductor current equals to the zero current again at the second time point, and count the time interval between the first and second time points; and using the logic circuit to compare whether the time interval is greater than the first time threshold, and if yes, using the logic circuit to output the first frequency selection signal, and if not, performing the next step;

using the logic circuit to compare whether the time interval is less than the second time threshold, if not, outputting the second frequency selection signal, and if yes, outputting the pulse-skipping signal;

using the control circuit to determine whether the logic circuit outputs the first frequency selection signal, and if yes, using the oscillation circuit to output the first oscillating signal, and transmitting the same to the filter circuit through the control circuit, and if not, performing the next step;

using the control circuit to determine whether the logic circuit outputs the second frequency selection signal, if yes, using the oscillation circuit to output the second oscillating signal, and transmitting the same to the filter circuit through the control circuit, and if not, performing the next step; and using the control circuit to determine whether the logic circuit outputs a pulse-skipping mode signal, and if yes, using the oscillation circuit to output the first oscillating signal, and modulating the first oscillating signal as a pulse-skipping signal to output to the filter circuit through the control circuit, and operating in the pulse-skipping mode.

As described above, the present disclosure provides a power converting device and a power converting method thereof, which can change from a normal operating mode utilizing a pulse width modulating mode to a low power mode and a pulse-skipping mode operated in a standby mode based on operation states of an electronic component such as a central processing unit, a microprocessor, or a programmable logic gate array element, so as to improve an efficiency of the power converting device while operating with light load by switching to plural of relatively low frequency/band.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
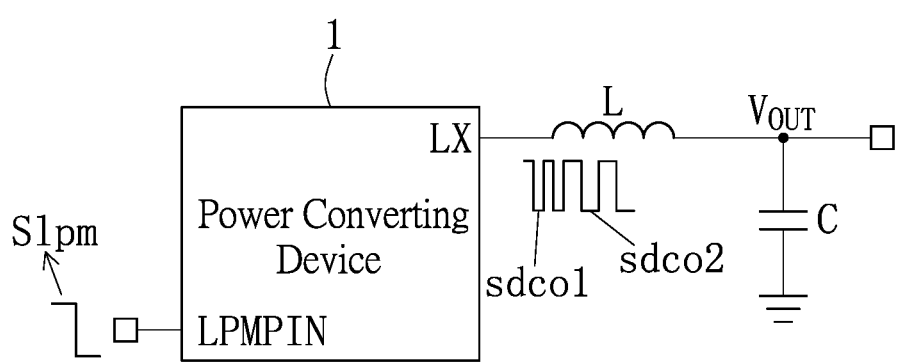
FIG. 1 is a block diagram showing a configuration of a power converting device applied to a central processing unit according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Various illustrative embodiments are described more fully hereinafter with reference to the accompanying drawings. However, the inventive concept may be embodied in many different forms and should not be construed as being limited to the illustrative embodiments set forth herein. Specifically, these exemplary embodiments are provided such that the present disclosure will be thorough and complete, and will fully convey those skilled in the art the scope of the inventive concept. In the figures, like numerals are used to indicate like elements.

It will be understood that, although the terms first, second, third, etc. may be used to describe various elements or signals, etc., such elements or signals are not limited by such terms. These terms are used to distinguish one element from another or a signal from another. In addition, as used herein, the term "or" may include all combinations of any one or more of the associated listed items.

Figure 2:
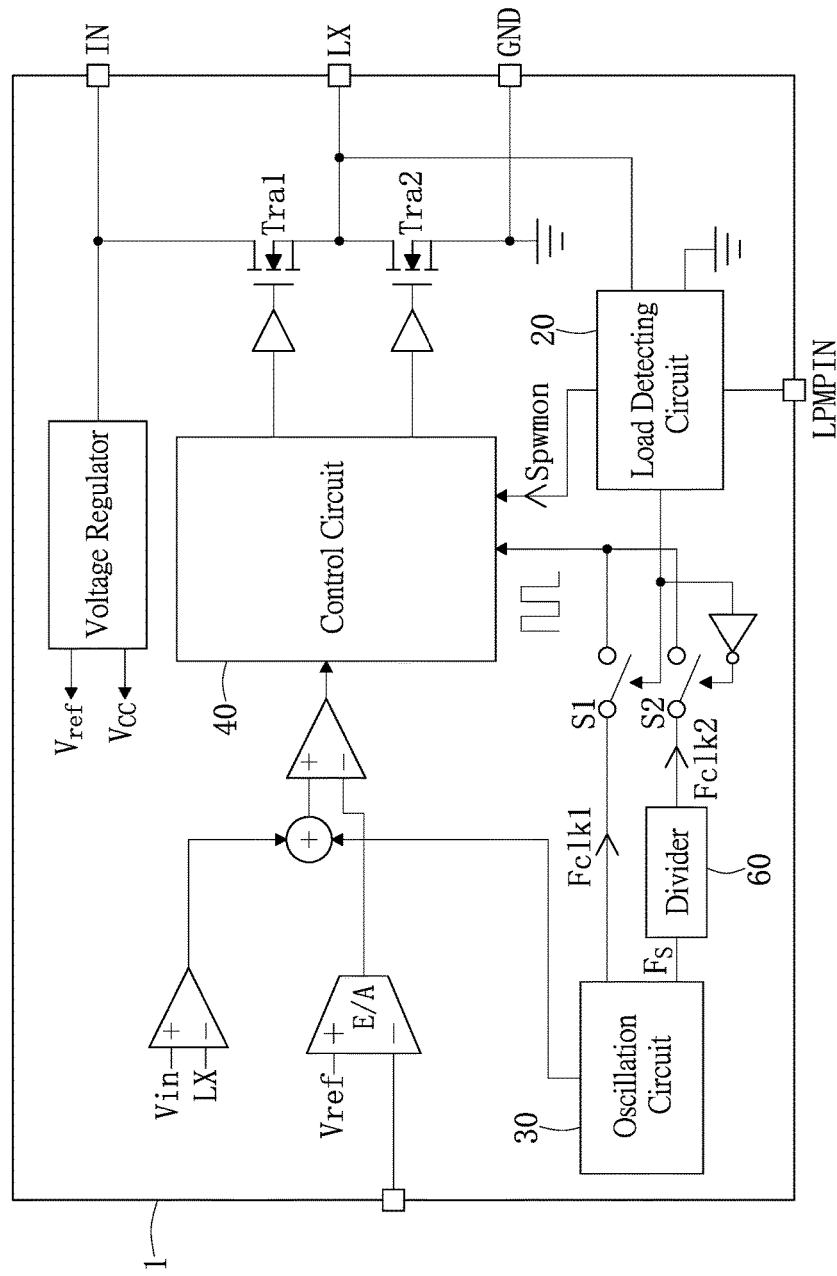
FIG. 2 is a circuit layout of a power converting device according to an embodiment of the present disclosure.
Figure 3:
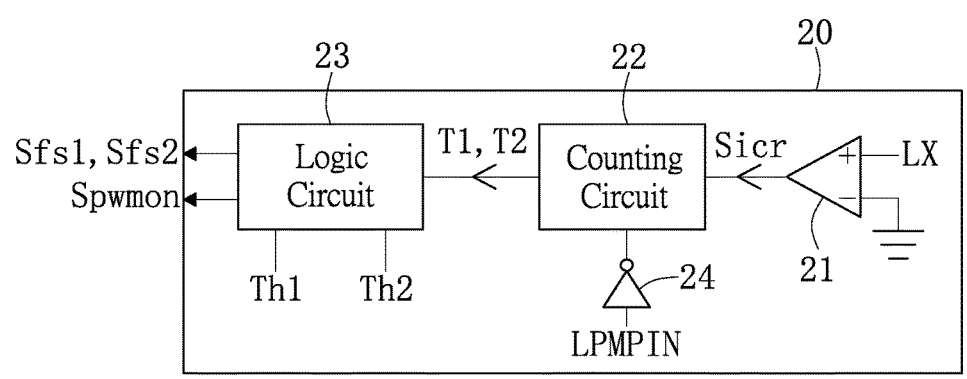
FIG. 3 is a circuit layout diagram of a load detecting circuit of the power converting device according to an embodiment of the present disclosure.
Figure 4:
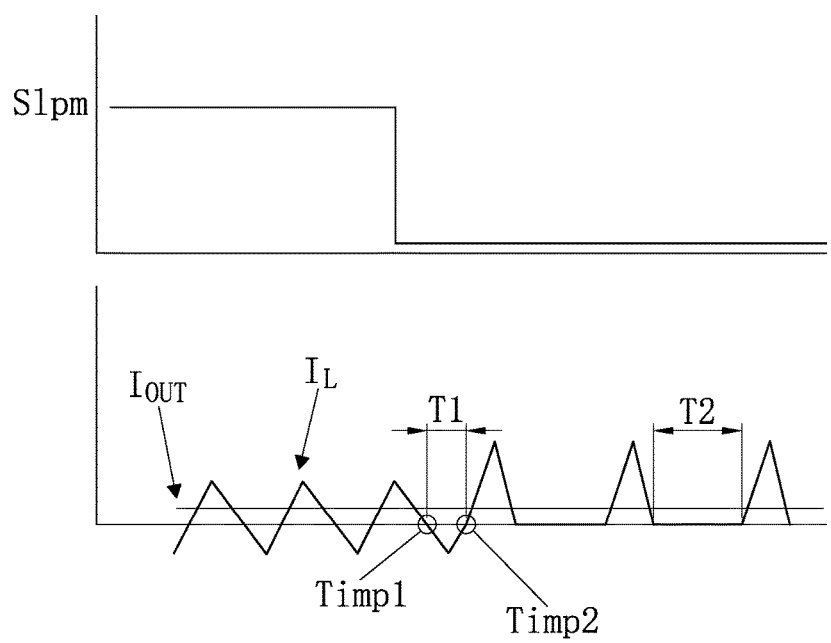
FIG. 4 is a first schematic view of an inductor current, a load current and a zero-crossing of the power converting device according to an embodiment of the present disclosure.
Figure 5:
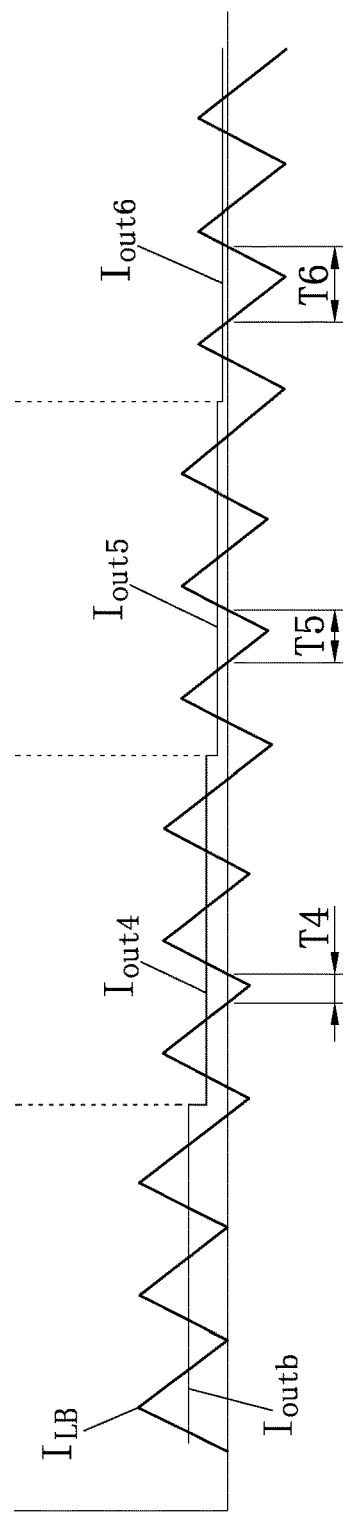
FIG. 5 is a second schematic view of an inductor current, a load current and a zero-crossing of the power converting device according to an embodiment of the present disclosure.

Reference is now made to FIGS. 1 to 5, FIG. 1 is a block diagram showing a configuration of a power converting device applied to a central processing unit according to an embodiment of the present disclosure, FIG. 2 is a circuit layout of a power converting device according to an embodiment of the present disclosure, FIG. 3 is a circuit layout diagram of a load detecting circuit of the power converting device according to an embodiment of the present disclosure, FIG. 4 is a first schematic view of a inductor current, a load current and a zero-crossing of the power converting device according to an embodiment of the present disclosure, and FIG. 5 is a second schematic view of a inductor current, a load current and a zero-crossing of the power converting device according to an embodiment of the present disclosure.

As shown in FIG. 1, the power converting device 1 is suitable for electronic elements for controlling the operation modes of various energy-consuming electronic devices, such as electronic elements such as a central processing unit, a microprocessor, or a programmable logic gate array element, which is for illustrative purposes only and is not limited thereto.

When the electronic element operates in the normal working mode, the normal working signal is output, the normal working signal can be a high level signal representing high voltage or high power consumption, and the counting circuit 22 is not triggered to operate. At this time, the operation of the power converting device 1 is in pulse width modulation (PWM) mode.

It should be noted that, as shown in FIGS. 1 to 3, when the electronic element operates in a low power mode, such as a standby state, the low power signal Slpm can be output and transmitted to a load detecting circuit 20 in the power converting device through a pin LPMPIN of the power converting device 1, so as to trigger the counting circuit 22 through an inverter 24 to be operated. The circuit and operation applied to the low power mode will be described in detail below.

As shown in FIGS. 1 and 2, an output terminal LX of the power converting device 1 is coupled to a filter circuit including an inductor L and a capacitor C. The inductor L and the capacitor C are connected in series with each other. One end of the inductor L is coupled to the output terminal LX, and both ends of the capacitor C are respectively connected to another end of the inductor L and a ground terminal. The output voltage Vout of the power converting device 1 is a capacitance voltage on the capacitor C.

As shown in FIG. 2, the power converting device 1 further includes a load detecting circuit 20, an oscillation circuit 30, and a control circuit 40. It should be noted that, as shown in FIG. 3, the load detecting circuit 20 includes a zero-crossing comparison circuit 21, a counting circuit 22, a logic circuit 23, and an inverter 24. An inverting input terminal of the zero-crossing comparison circuit 21 is grounded, and a non-inverting input terminal of the zero-crossing comparison circuit 21 is coupled to the inductor L of the filter circuit through the output terminal LX. The output terminal of the zero-crossing comparison circuit 21 is coupled to an input terminal of the counting circuit 22. An output terminal of the counting circuit 22 is coupled to an input terminal of the logic circuit 23.

As shown in FIGS. 2 and 3, the output terminal of the logic circuit 23 of the load detecting circuit 20 is coupled to the control circuit 40. The control circuit 40 is coupled to a switching circuit including a first transistor Tra1 and a second transistor Tra2. The first transistor Tra1 has a drain as a first end, a source as a second end, and a gate as a first control terminal. Similarly, the second transistor Tra2 has a drain as a third terminal, a source as a fourth terminal, and a gate as a second control terminal. The drain of the first transistor Tra1 is coupled to an input terminal IN of the power converting device 1, for example, to a voltage source to obtain an input voltage. The source of the first transistor Tra1 is coupled to the drain of the second transistor Tra2. The source of the second transistor Tra2 is grounded. The gate of the first transistor Tra1 and the gate of the second transistor Tra2 are coupled to the control circuit 40. The inductor L of the filter circuit is coupled between the source of the first transistor Tra1 and the drain of the second transistor Tra2 through the output terminal LX.

The logic circuit 23 of the load sensing circuit 20 can output a first frequency selection signal Sfs1 to turn on the first switch S1, and can also output the second frequency selection signal Sfs2 to turn on the second switch S2. At this time, the control circuit 40 can be coupled to the oscillation circuit 30 through another set of switching circuits, the set of switching circuits includes the first switch S1 and the second switch S2. Specifically, the control circuit 40 can be directly coupled to the oscillation circuit 30 through the first switch S1. Different from the first switch S1 directly coupled to the oscillation circuit 30, a divider 60 can be disposed between the second switch S2 and the oscillation circuit 30, so that the control circuit 40 is coupled to the oscillation circuit 30 sequentially through the second switch S2 and the divider 60. In addition, an inverter 24 may be additionally provided and coupled between the logic circuit 23 and the second switch S2.

As shown in the embodiment of FIG. 3, the zero-crossing comparison circuit 21 may be a current or a voltage comparator, for example, the zero-crossing comparison circuit 21 can receive and compare the inductor current IL of the inductor L with a zero current, or compare the inductor voltage of the inductor L with the zero voltage, and estimate whether the inductor current IL is zero through the inductor voltage and the inductance value. When the zero-crossing comparison circuit 21 compares that the inductor current IL equals to zero current, that is, the current value of the inductor current IL is zero, the zero-crossing comparison circuit 21 outputs the zero-crossing signal Sicr to the counting circuit 22.

As shown in FIG. 1, the central processing unit (or other electronic components in practice) operates in the low power mode, such as a standby state, and outputs a low power signal Slpm, as shown in FIG. 4, when the signal is changed from a high level signal in a normal operating mode to a low level signal representing low voltage or low power consumption, the counting circuit 22 is activated by the inverter 24. The operation of the counting circuit 22 includes counting a number of zero-crossings and a time interval between the zero-crossings, etc., as described in detail below.

As shown in FIG. 3, when the counting circuit 22 is triggered, the zero-crossing signal Sicr can be received from the zero-crossing comparison circuit 21. Alternatively, the counting circuit 22 may continue to receive the zero-crossing signal Sicr from the zero-crossing comparison circuit 21 before and after the triggering. Upon receiving the low power signal Slpm of the electronic element such as the central processing unit, the counting circuit 22 determines that the inductor current IL shown in FIG. 4 equals to/crosses the zero current at the first time point Timp1 according to the zero-crossing signal Sicr. Until the inductor current IL again equals to/crossing the zero current at a second time point Timp2, the counting circuit 22 stops counting and counts the time interval T1 between the first time point Timp1 and the second time point Timp2. Further, a time interval T2 greater than the interval time T1, and other time intervals may be acquired in a manner similar to the interval time T1.

Different from the inductor current IL and the load current Iout as shown in FIG. 4, the load current Ioutb shown in FIG. 5 generates load currents Iout4, Iout5, and Iout6 having different current values as a function of time, which respectively correspond to inductor currents ILB having different current values. The inductor current ILB of the inductor L is in a sawtooth waveform. When the partial valley current value of the inductor current ILB is lower than zero, the time intervals T4, T5, and T6 of the inductor current ILB and the two zero currents are inversely proportional to the magnitudes of the load currents Iout4, Iout5, and Iout6. For example, when Iout4>Iout5>Iout6, T4<T5<T6. Therefore, by using the interval times T1, T2 shown in FIG. 4 and the time intervals T4, T5, and T6 as shown in FIG. 5, information on the magnitudes of the load currents Iout and Ioutb can be obtained, thereby determining the frequency to be switched, which will be further explained below.

The logic circuit 23 may pre-store a first time threshold Th1 and a second time threshold Th2 or more time thresholds, and the number and size of the set time thresholds depend on the number of switching frequency bands. For example, in the embodiment, three frequency bands are switched as an example, and two time threshold values are selected and set, which are only illustrated by way of example and not intend to limit thereto.

The logic circuit 23 can obtain count results from the counter circuit 22, including the time intervals T1, T2, T4, T5, T6, etc. as described above. When the logic circuit 23 determines that the time interval is greater than the first time threshold Th1, the first frequency selection signal Sfs1 is output to turn on the first switch S1. At this time, the first oscillating signal Sdco1 output by the oscillation circuit 30 can be supplied to the control circuit 40 through the first switch S1. Next, the control circuit 40 can supply the first oscillating signal Sdco1 to the filter circuit through the output terminal Lx as shown in FIG. 1 to be filtered by the inductor L and the capacitor C of the filter circuit.

Conversely, when the logic circuit 23 determines that the interval time is less than the first time threshold Th1, the second frequency selection signal Sfs2 is output. At this time, the second oscillating signal Sdco2 outputted by the oscillation circuit 30 can be supplied to the control circuit 40 through the second switch S2. Then, the control circuit 40 can supply the second oscillating signal Sdco2 to the filter circuit through the output terminal Lx as shown in FIG. 1. The frequency of the second oscillating signal Sdco2 is smaller than the frequency of the first oscillating signal Sdco1.

When the logic circuit 23 determines that the time interval is less than the second time threshold Th2, in that the second time threshold Th2 can be less than the first time threshold Th1, the first frequency selection signal Sfs1 is output to turn on the first switch S1, and the first oscillating signal Sdco1 output from the oscillation circuit 30 can be supplied to the control circuit 40 through the first switch S1. Meanwhile, as shown in FIGS. 3 and 4, the logic circuit 23 outputs a pulse-skipping mode signal Spwmon to the control circuit 40. Next, the control circuit 40 modulates the first oscillating signal Sdco1 from the oscillation circuit 30 into a pulse-skipping signal Spwm to be output to the filter circuit to operate in the pulse-skipping mode. For example, the control circuit 40 can alternately control switching times of the transistors Tra1, Tra2 of the switching circuit between the control circuit 40 and the inductor L, so as to reduce the switching frequency at light load to output a pulse-skipping signal Spwm to the filter circuit. Thereby, the switching loss can be effectively reduced, so as to improve the efficiency under light load.

Figure 6:
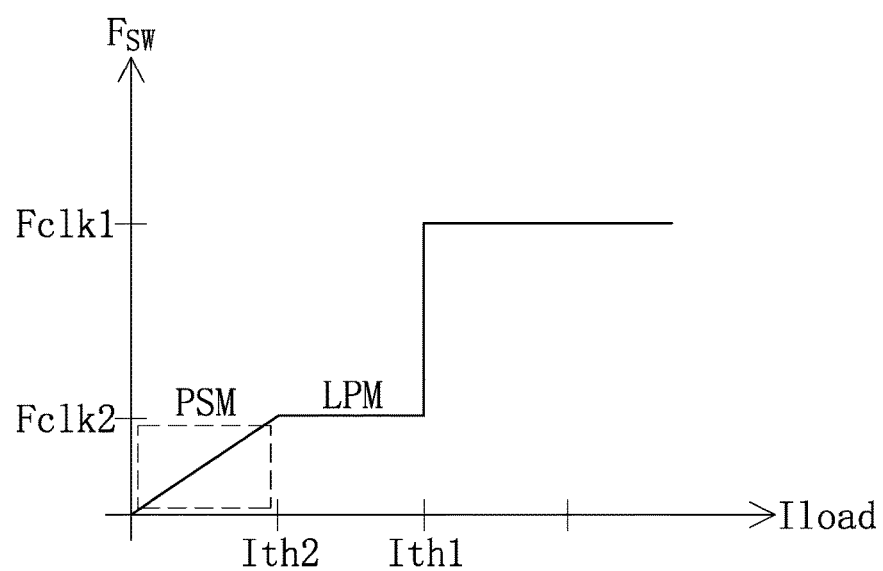
FIG. 6 is a graph showing different switching frequencies versus load currents of a power conversion device operating in a low power mode and a pulse-skipping mode according to an embodiment of the present disclosure.

Reference is now made to FIG. 6, which is a graph showing different switching frequencies versus load currents of a power conversion device operating in a low power mode and a pulse-skipping mode according to an embodiment of the present disclosure. As shown in FIG. 6, the switching frequency Fsw of the power converting device according to the embodiment of the present disclosure can be divided into three frequency bands, depending on changes in the operating states of electronic elements, such as a central processing unit, a microprocessor, or a programmable logic gate array element, and switching between three different frequency bands, which is described below.

For the relatively highest frequency band, when the load current Iload is greater than the first current threshold value Ith1, the switching frequency Fsw is maintained at the first oscillating frequency Fclk1. For example, the first oscillating frequency Fclk1 may be 600 kHz, which is exemplified herein, and is not limited thereto.

For the intermediate frequency band, when the load current Iload is greater than the second current threshold value Ith2 and less than the first current threshold value Ith1, the power converting device enters the low power mode LPM, and the switching frequency Fsw is maintained at the second oscillating frequency Fclk2. For example, the second oscillating frequency Fclk2 may be 120 kHz, but not limited thereto. Actually, the set switching frequency Fsw value may be determined according to transmission medium or carrier that is applied, such as ADSL.

For the relatively lowest frequency band, when the load current Iload is less than the second current threshold value Ith2, the power converting device switches from the low power mode LPM to the pulse-skipping mode PSM, the selected switching frequency Fsw is smaller than the first oscillating frequency Fclk1 and the second oscillating frequency is Fclk2, and the switching frequency Fsw and the load current Iload have a stable linear relationship.

As described above, in the embodiment of the present disclosure, the oscillation circuit of the power converting device supplies the first oscillating frequency Fclk1 and the second oscillating frequency Fclk2 having fixed frequency values, and further modulates the pulse-skipping frequency generated by the first oscillating frequency Fclk1 via the control circuit 40 to have a stable linear variation. Compared with the conventional power converting device supplying varying frequencies (not like frequencies being a fixed value or a stable linear changing value as in the embodiment of the present disclosure) having different frequency values over a range of frequency, the power converting device of the embodiments of the present disclosure outputs a relatively stable frequency in the low power mode, and can avoid generating noise during the frequency variation.

Figure 7:
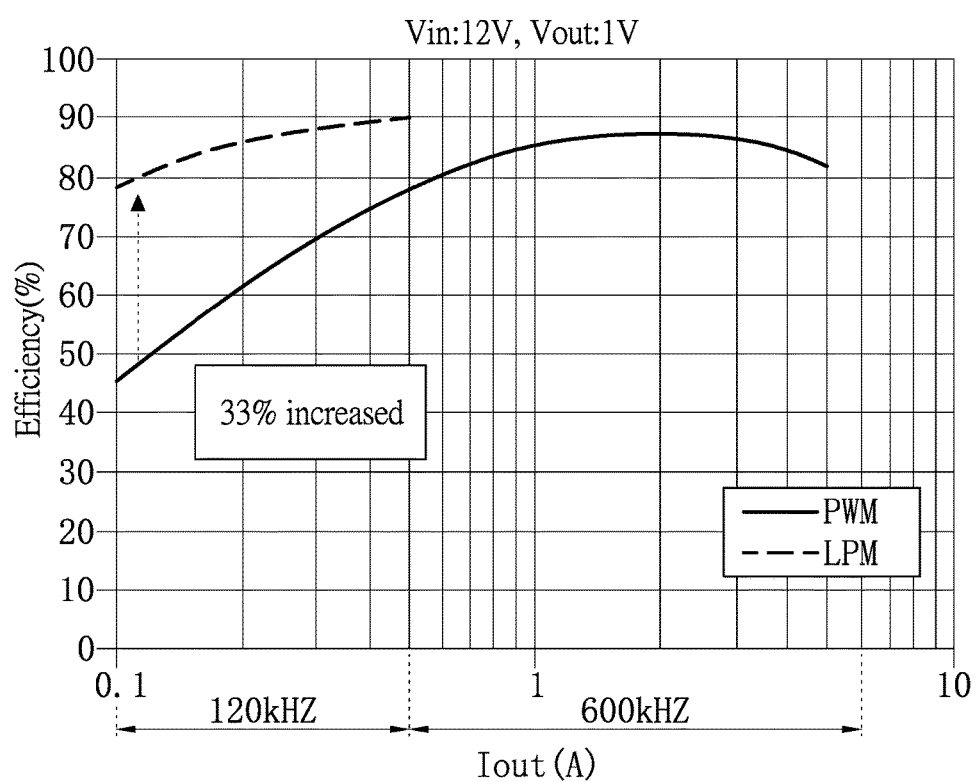
FIG. 7 is a graph showing efficiency versus load current of a power conversion device at a light load before and after frequency switching according to an embodiment of the present disclosure.

Reference is now made to FIG. 7, which is a graph showing efficiency versus load current of a power conversion device at a light load before and after frequency switching according to an embodiment of the present disclosure.

As shown in FIG. 7, the horizontal axis represents the load current Iout, and the vertical axis represents the operational efficiency of the power converting device at light loads. Compared to the curve representing the power converting device operating in the pulse width modulation mode PWM, the curve representing the power converting device operating in the low power mode LPM has a relatively high efficiency, for example, in a condition that the input voltage Vin is 12 volt, Vout is 1 volt, the load current Iout is about 0.1 amps, and a frequency is 120 kHZ, the efficiency can be increased by 33%. It should be understood that the power converting device will have different levels of efficiency improvement according to the operation mode of the electronic element such as the central processing unit. For example, as the load current Iout decreases, a large efficiency increase can be obtained.

Figure 8:
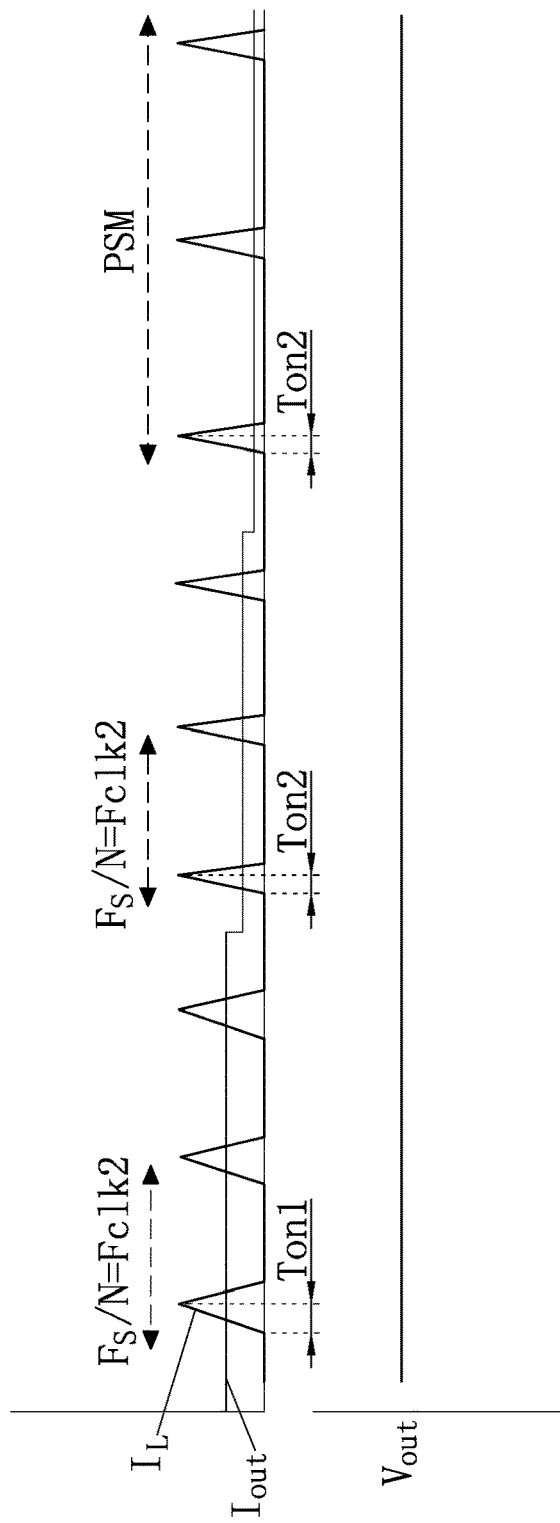
FIG. 8 is a schematic diagram showing changes in inductor current, load current, and output voltage of a power converting device operating in a low power mode and a pulse-skipping mode according to an embodiment of the present disclosure.

Reference is now made to FIG. 8, which is a schematic diagram showing changes in inductor current, load current, and output voltage of a power converting device operating in a low power mode and a pulse-skipping mode according to an embodiment of the present disclosure.

As shown in FIG. 8, when the power converting device of the embodiment of the present disclosure operates in the low power mode, the switching frequency may be a frequency (Fs/N) generated after the third oscillation frequency Fs of the third oscillating signal output by the oscillation circuit is divided by the preset divisor value N, that is, the second oscillation frequency is generated. In this case, the third oscillation frequency Fs may have a frequency value of the same magnitude as the first oscillating signal Sdco1. The second oscillating frequency is not limited to a fixed frequency, and the third oscillating frequency Fs having different frequency values is output by the oscillation circuit according to different applications or user conditions, and the preset divisor value N with different magnitudes may be selected to determine different second oscillation frequencies.

In the low power mode, different switch on-times Ton1, Ton2 can be provided as the inductor current IL changes. When the load current Iout becomes smaller, the switch on-time Ton2 is the minimum on-time, and the on-time cannot be reduced anymore. In the case of a fixed frequency, the energy provided by the converter is constant, but the energy required by the load is reduced, which will result in rising output voltage. In order to avoid this situation, in the embodiment of the present disclosure, in addition to the two frequency switching in the low power mode (or more switching frequency/band can be set in practice), the power converting device will switch from the low power mode to the pulse-skipping mode to reduce the frequency and keep the output stable. The output voltage Vout as shown in FIG. 8 is a straight line, without having a voltage rising ramp wave which is caused when the power converting device is not switched to the pulse-skipping mode.

Figure 9:
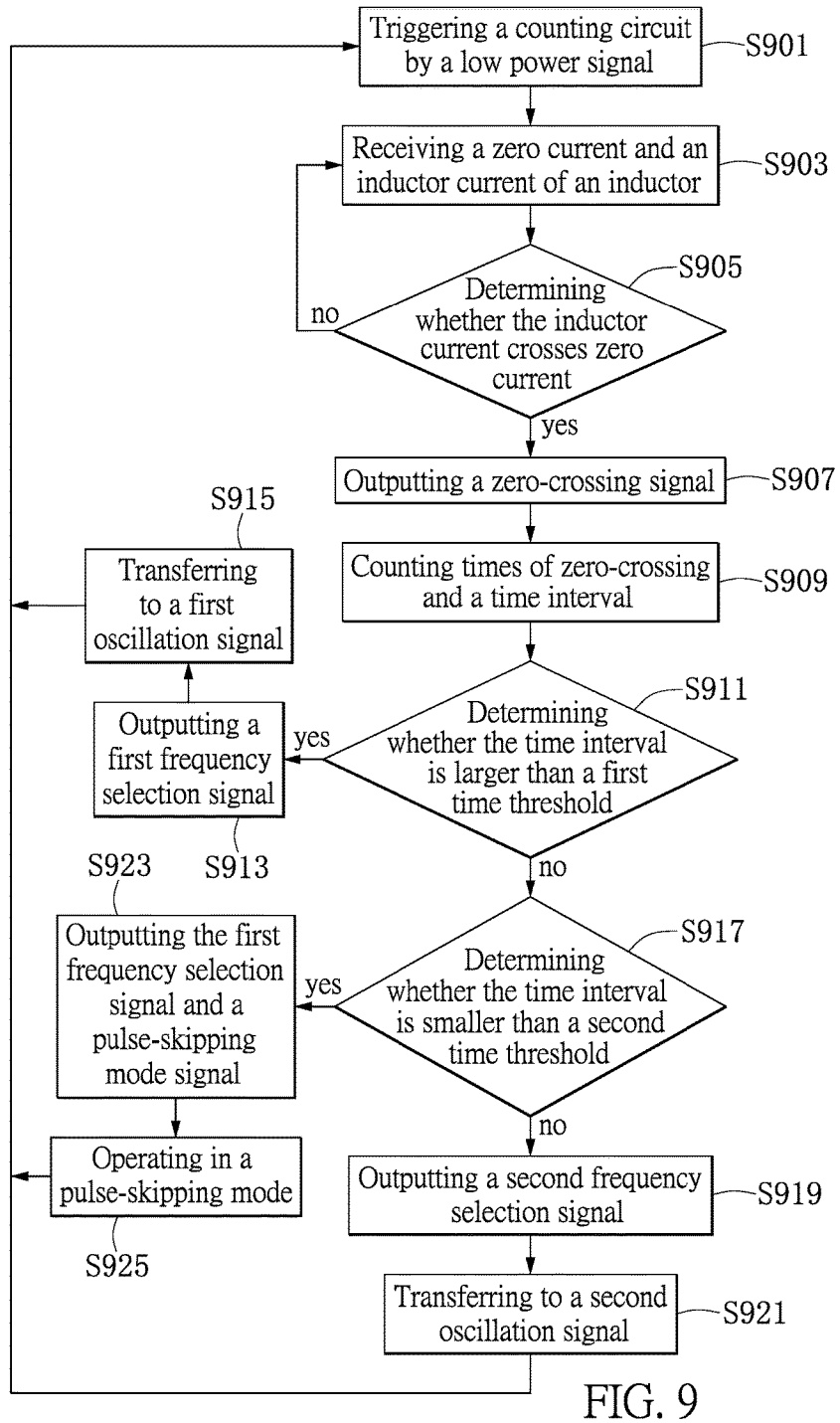
FIG. 9 is a flow chart showing steps of a power converting method applied to a power converting device according to an embodiment of the present disclosure.

Reference is now made to FIG. 9, which is a flow chart showing steps of a power converting method applied to a power converting device according to an embodiment of the present disclosure. As shown in FIG. 9, a power converting method provided by the present disclosure, applicable to the power converting device, the power converting method including:

Step S901: using the electronic element to output the low power signal to trigger the counting circuit.

Step S903: using the zero-crossing comparison circuit to receive the zero current and the inductor current flowing through the inductor, and the method proceeds to step S905: comparing whether the inductor current is equal to the zero current, and if yes, the method proceeds to step S907: outputting the zero-crossing signal, if not, repeating the step S903.

Step S909: using the counting circuit to start to count at the first time point when the inductor current reaches to the zero current, stop to count until the inductor current equals to the zero current again at the second time point, and count the time interval between the first and second time points.

Step S911: using the logic circuit to determine whether the time interval is greater than the first time threshold, and if yes, the method proceeds to step S913: using the logic circuit to output the first frequency selection signal, and the method proceeds to step S915: using the oscillation circuit to output the first oscillating signal according to the first frequency selection signal, and transmitting, through the control circuit, the first oscillating signal to the filter circuit, and if not, the method proceeds to step S917.

Step S917: using the logic circuit to determine whether the time interval is less than the second time threshold, and if not, the method proceeds to step S919: using the logic circuit to output the second frequency selection signal, and the method proceeds to step S921: using the oscillation circuit to output the second oscillating signal according to the second frequency selection signal, and transmitting, through the control circuit, the second oscillating signal to the filter circuit, and if yes, the method proceeds to step S923.

Step S923: using the logic circuit to output the pulse-skipping mode signal and the first selection signal, and the method proceeds to step S925: using the oscillation circuit to output the first oscillating signal according to the first selection signal, and modulate the first oscillate as the pulse-skipping signal according to the pulse-skipping mode signal through the control circuit, and operating in the pulse-skipping mode.

As described above, the present disclosure provides a power converting device and a power converting method thereof, which can change from a normal operating mode utilizing a pulse width modulating mode to a low power mode and a pulse-skipping mode operated in a standby mode based on operation states of an electronic component such as a central processing unit, a microprocessor, or a programmable logic gate array element, so as to improve an efficiency of the power converting device while operating with light load by switching to plural of relatively low frequency/band, and maintaining stable frequency without noise interference in the low power mode.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching. The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power converting device, applicable to an electronic element, the electronic device respectively outputs a normal operation signal and a low power signal in a normal operation mode and a low power mode, and the power converting device comprising:
   a filter circuit including an inductor and a capacitor, wherein two ends of the capacitor are respectively coupled to one end of the inductor and grounded; and
   a load detecting circuit, including:
      a zero-crossing comparison circuit having a first input terminal and a second input terminal respectively coupled to another end of the inductor and a ground terminal, wherein when the zero-crossing compares that an inductor current flowing through the inductor is equal to a zero current, outputs a zero-crossing signal;
      a counting circuit coupled to the electronic element and the zero-crossing comparison circuit, wherein when the counting circuit receives the low power signal and the zero-crossing signal, the counting circuit starts to count at a first time point when the inductor current equals to the zero current, and stops to count until the inductor current equals to the zero current again at a second time point, and counts a time interval between the first and second time points; and
      a logic circuit coupled to the counting circuit, wherein the logic circuit stores a first time threshold and a second time threshold, outputs a first frequency selection signal when the logic circuit compares that the time interval is larger than the first time threshold, outputs a second frequency selection signal when the logic circuit compares that the time interval is smaller than the first time threshold, and outputs the first frequency selection signal and a pulse-skipping mode signal when the logic circuit compares the time interval is smaller than the second time threshold;

an oscillation circuit coupled to the logic circuit, wherein the oscillation circuit outputs a first oscillating signal and a second oscillating signal, and wherein a second oscillating frequency of the second oscillating signal is smaller than a first oscillating frequency of the first oscillating signal; and a control circuit coupled to the logic circuit, the oscillation circuit and the another end of the inductor, wherein when the logic circuit outputs the first frequency selection signal, the control circuit transmits the first oscillating signal from the oscillation circuit to the filter circuit, when the logic circuit outputs the second frequency selection signal, the control circuit transmits the second oscillating signal from the oscillation circuit to the filter circuit, and when the control circuit receives the pulse-skipping mode signal, the control circuit modulates the first oscillating signal from the oscillation circuit as a pulse-skipping signal to output to the filter circuit, and operates in a pulse-skipping mode.

2. The power converting device according to claim 1, further including a switch circuit coupled between the logic circuit and the oscillation circuit, wherein the control circuit is coupled to the oscillation circuit through the switch circuit, the switch circuit includes a first switch and a second switch, when the logic circuit outputs the first frequency selection signal to turn on the first switch, the control circuit obtains the first oscillating signal, and when the logic circuit outputs the second frequency selection signal to turn on the second switch, the control circuit obtains the second oscillating signal.

3. The power converting device according to claim 2, further including a divider coupled between the second switch and the oscillation circuit, wherein the oscillation circuit outputs a third oscillating signal to the divider, the divider divides a third oscillating frequency of the third oscillating signal by a preset divisor value to output the second oscillating signal having the second oscillating frequency to the control circuit through the second switch.

4. The power converting device according to claim 3, wherein the third oscillating frequency of the third oscillating signal is the same as the first oscillating frequency of the first oscillating signal.

5. The power converting device according to claim 2, further including an inverter connected between the logic circuit and the second switch.

6. The power converting device according to claim 1, wherein the load detecting circuit further comprises an inverter coupled between the logic circuit and the electronic element.

7. A power converting method, applicable to the power converting device according to claim 1, the power converting method comprising:

using the electronic element to output the low power signal to trigger the counting circuit;

using the zero-crossing comparison circuit to receive the zero current and the inductor current flowing through the inductor, and compare whether the inductor current is equal to the zero current, and if yes, outputting the zero-crossing signal, if not, repeating the step;

using the counting circuit to start to count at the first time point when the inductor current reaches to the zero current, stop to count until the inductor current equals to the zero current again at the second time point, and count the time interval between the first and second time points; and using the logic circuit to determine whether the time interval is greater than the first time threshold, and if yes, using the logic circuit to output the first frequency selection signal, using the oscillation circuit to output the first oscillating signal according to the first frequency selection signal, and transmitting, through the control circuit, the first oscillating signal to the filter circuit, and if not, performing the next step;

using the logic circuit to determine whether the time interval is less than the first time threshold, and if not, using the logic circuit to output the second frequency selection signal, using the oscillation circuit to output the second oscillating signal according to the second frequency selection signal, and transmitting, through the control circuit, the second oscillating signal to the filter circuit, and if yes, performing the next step; and using the logic circuit to output the pulse-skipping mode signal and the first selection signal, using the oscillation circuit to output the first oscillating signal according to the first selection signal, and modulate the first oscillate as the pulse-skipping signal according to the pulse-skipping mode signal through the control circuit, and operating in the pulse-skipping mode.

8. The power converting method according to claim 7, further including:

using the logic circuit to output the first frequency selection signal to turn a first switch; and using the oscillating circuit to output the first oscillating signal to the control circuit through the first switch.

9. The power converting method according to claim 7, further including:

using the logic circuit to output the second frequency selection signal to turn on a second switch; and using the oscillation circuit to output the second oscillating signal to the control circuit through the second switch.

10. The power converting method according to claim 7, further including:

using the oscillation circuit to output a third oscillating signal to a divider; and using the divider to divide a third oscillating frequency of the third oscillating signal by a preset divisor value, to output the second oscillating signal having the second oscillating frequency to the control circuit through a second switch.

* * * * *